(12) United States Patent
Bhattacharya et al.

(10) Patent No.: US 7,642,807 B2
(45) Date of Patent: Jan. 5, 2010

(54) MULTIPLE-MODE COMPENSATED BUFFER CIRCUIT

(75) Inventors: Dipankar Bhattacharya, Macungie, PA (US); Gregg R. Harleman, Jim Thorpe, PA (US); Makeshwar Kothandaraman, Whitehall, PA (US); John C. Kriz, Palmerton, PA (US); Bernard L. Morris, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 216 days.

(21) Appl. No.: 11/768,496

(22) Filed: Jun. 26, 2007

(65) Prior Publication Data
US 2009/0002017 A1    Jan. 1, 2009

(51) Int. Cl.
*H03K 17/16* (2006.01)
(52) U.S. Cl. .............................. 326/21; 326/30; 327/409
(58) Field of Classification Search .................... 326/21, 326/26, 30, 32, 87; 327/170, 407–409
See application file for complete search history.

(56) References Cited

U.S. PATENT DOCUMENTS 6,307,791 B1 * 10/2001 Otsuka et al. .......... 365/189.05
6,445,316 B1 *  9/2002 Hsu et al. .................... 341/120

* cited by examiner

*Primary Examiner*—Daniel D Chang
(74) *Attorney, Agent, or Firm*—Ryan, Mason & Lewis, LLP

(57) ABSTRACT

A compensated buffer circuit operative in one of at least a first mode and a second mode includes a plurality of output blocks and a plurality of predrivers, each of the predrivers having an output connected to an input of a corresponding one of the output blocks. Respective outputs of the output blocks are connected together and form an output of the buffer circuit. The output blocks are arranged in a sequence and are binary weighted such that a drive strength of a given one of the output blocks is about twice as large as a drive strength of an output block immediately preceding the given output block. Each of the predrivers selectively enables the corresponding output block connected thereto as a function of a control signal supplied to the predriver for compensating the buffer circuit for PVT variations to which the buffer circuit may be subjected. The respective control signals supplied to the predrivers collectively represent a binary code word, the binary code word in the second mode being equivalent to an arithmetic shift of the binary code word in the first mode.

21 Claims, 5 Drawing Sheets

MULTIPLE-MODE COMPENSATED BUFFER CIRCUIT

FIELD OF THE INVENTION

The present invention relates generally to electronic circuits, and more particularly relates to compensation techniques in a buffer circuit.

BACKGROUND OF THE INVENTION

In modern electronic circuits, such as, for example, input/output (IO) buffers, it is desirable to control the variation of output impedance of the IO buffers for a variety of reasons, including, but not limited to, transmission line matching, minimizing switching noise (e.g., di/dt), optimizing signal swing, etc. In many high-speed applications, such as, for example, memory interfacing, it is important that the buffer output impedance closely matches the impedance of a circuit board to which the buffer is connected in order to reduce signal degradation. Tight control of output impedance is also required to reduce ground bounce.

In order to achieve such tight control of output impedance, a buffer, often referred to as a compensated buffer, is typically employed which is adapted to compensate for variations in process, supply voltage and/or temperature (PVT) conditions to which the buffer may be subjected. In one implementation, a PVT compensated buffer utilizes a PVT control block which monitors the variation of a block of one or more reference devices matched to corresponding devices (pre-drivers) in an output stage of the buffer to be compensated. The PVT control block generates a set of digital bits (PVTBITS) that are used to control the reference devices (e.g., turning the devices on or off) so as to maintain a constant output impedance. The output impedance of the reference block will be a function of the number of devices in the block that are turned on or off at any given time. These bits are also fed to the buffer to control the output impedance of the buffer output stage devices in a similar manner. The number of pre-drivers in the buffer output stage is directly proportional to the number of digital control bits.

Various IO standards, such as, for example, stub series terminated logic (SSTL), high-speed transceiver logic (HSTL), etc., specify the output impedance and/or output current of a receiver at specific values of output voltage (e.g., Vol or Voh) in order to ensure that there is sufficient margin for the receiver to function properly. Depending on certain requirements, SSTL and HSTL buffers can operate either in Class-I mode or in Class-II mode. In Class-I mode, an output drive strength of the buffer is such that the output impedance is twice that of the buffer operating in Class-II mode. While it would be advantageous to have a single buffer capable of operating in either Class-I or Class-II mode, standard buffer designs have, thus far, not be able to achieve this in an area efficient manner.

In a first known approach for implementing a buffer capable of operating in either Class-I or Class-II mode, two complete buffers, one buffer corresponding to Class-I output drive strength and a second buffer corresponding to Class-II output drive strength, are simply connected in parallel with one another. This approach, however, consumes significant silicon area and power and is therefore undesirable. In a second known approach, pre-drivers and output drivers used in a Class-I buffer are replicated twice in the same buffer; one set of pre-drivers and output drivers is turned on during Class-I operation and both sets are turned on during Class-II operation. This approach, however, still consumes substantial silicon area and is therefore not preferred.

Accordingly, there exists a need for an improved buffer circuit capable of operating in both Class-I and Class-II modes and that does not suffer from one or more of the problems exhibited by conventional buffer circuit designs.

SUMMARY OF THE INVENTION

The present invention meets the above-noted need by providing, in illustrative embodiments thereof, a buffer circuit selectively operative in either a Class-I mode or a Class-II mode in such a way that the area penalty is reduced compared to conventional buffer design approaches. To accomplish this, illustrative embodiments of the invention compensate the buffer circuit based on Class-I operation (for low power) and perform an arithmetic left shift on the digital compensation bits for Class-II operation (for higher power) in the buffer so that the pre-drivers used for the lower drive strength mode are utilized in the higher drive strength mode of operation. This can be accomplished with the inclusion of only one additional predriver stage in the buffer. Since certain applications may employ a significantly large quantity of buffers (e.g., hundreds) in a single chip, a small area savings in each buffer can translate into considerable savings in overall chip area and is thus beneficial.

In accordance with an embodiment of the invention, a compensated buffer circuit operative in one of at least a first mode and a second mode includes a plurality of output blocks and a plurality of predrivers, each of the predrivers having an output connected to an input of a corresponding one of the output blocks. Respective outputs of the output blocks are connected together and form an output of the buffer circuit. The output blocks are arranged in a sequence and are binary weighted such that a drive strength of a given one of the output blocks is about twice as large as a drive strength of an output block immediately preceding the given output block. Each of the predrivers selectively enables the corresponding output block connected thereto as a function of a control signal supplied to the predriver for compensating the buffer circuit for PVT variations to which the buffer circuit may be subjected. The respective control signals supplied to the predrivers collectively represent a binary code word, the binary code word in the second mode being equivalent to an arithmetic shift of the binary code word in the first mode. Embodiments of the invention may be implemented in an integrated circuit, which may in turn be employed in an electronic system.

In accordance with another embodiment of the invention, a method is provided for controlling an output drive strength of a compensated buffer circuit, the buffer circuit including a plurality of output blocks, the output blocks being arranged in a sequence and being binary weighted such that a drive strength of a given one of the output blocks is about twice as large as a drive strength of an output block immediately preceding the given output block, and a plurality of predrivers, each of the predrivers having an output connected to an input of a corresponding one of the output blocks. The method comprises the steps of: supplying each of the predrivers with a control signal for compensating the buffer circuit for variations in at least one of process, voltage and temperature (PVT) conditions to which the buffer circuit may be subjected, the respective control signals supplied to the predrivers collectively representing a binary code word; in a first mode of operation of the buffer circuit, arithmetically shifting the binary code word supplied to the predrivers at least one bit position in a direction toward a least significant bit of the binary code word; and in a second mode of operation of the buffer circuit, arithmetically shifting the binary code word supplied to the predrivers at least one bit position in a direction toward a most significant bit of the binary code word, the output drive strength of the buffer circuit in the second mode being about twice the output drive strength of the buffer circuit in the first mode.

These and other features, objects and advantages of the present invention will become apparent from the following detailed description of illustrative embodiments thereof which is to be read in connection with the accompanying drawings.

DETAILED DESCRIPTION OF THE INVENTION

The present invention will be described herein in the context of illustrative buffer circuits adapted to selectively operate with either Class-I output drive strength (for low power) or Class-II output drive strength (for high power). It should be understood, however, that the present invention is not limited to these or any other particular circuit arrangements. Rather, the invention is more generally applicable to techniques for forming an area efficient compensated buffer circuit capable of operation in at least two different drive modes (e.g., Class-I or Class-II). To accomplish this, embodiments of the invention compensate the buffer circuit based on Class-I operation and perform an arithmetic left shift on digital compensation bits for Class-II operation in the buffer, thereby effectively multiplying by two.

Although implementations of the present invention described herein may be implemented using p-channel metal-oxide-semiconductor (PMOS) and n-channel metal-oxide-semiconductor (NMOS) transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

Figure 1:
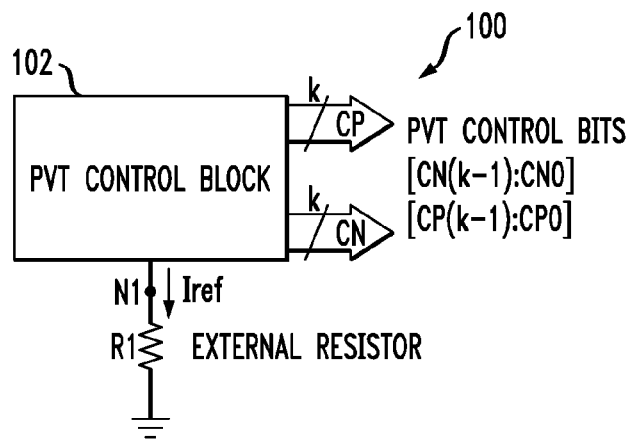
FIG. 1 is a schematic diagram depicting an illustrative PVT compensation circuit which may be used to compensate a buffer for variations in PVT conditions to which the buffer may be subjected.

FIG. 1 is a schematic diagram depicting at least a portion of an illustrative PVT compensation circuit 100 which may be suitable for use with the present invention. As apparent from the figure, compensation circuit 100 includes a PVT control block 102 coupled to a resistor R1, or alternative resistive element. Specifically, a first terminal of resistor R1 is preferably connected to the PVT control block 102 at node N1 and a second terminal of R1 is adapted for connection to a voltage return of the PVT control block, which may be ground. Resistor R1 is preferably a precision external resistor, although an internal resistor may alternatively be used where a lower accuracy can be tolerated. Resistor R1 is used to generate a substantially constant current, Iref, within the PVT block 102 which is either forced into one or more monitor devices (not shown) in the PVT control block 102 or is compared against a current generated in the one or more monitor devices. The monitor devices are preferably substantially matched to one or more corresponding devices forming an output stage of a buffer circuit to be compensated. In this manner, the PVT control block 102 will more accurately compensate for variations in PVT conditions to which the buffer circuit may be subjected.

PVT control block 102 preferably generates a set of k digital PVT control bits, where k is a positive integer. As shown in the figure, PVT control block 102 generates a first set of k PVT control bits, CP(k−1):CP0 for compensating one or more PMOS devices in an output stage of the buffer circuit to be compensated. Likewise, PVT control block 102 generates a second set of k PVT control bits, CN(k−1):CN0 for compensating one or more NMOS devices in the output stage of the buffer circuit to be compensated. In alternative embodiments, PVT control block 102 may generate only one set of control bits for compensating either PMOS devices or NMOS devices, as may be appropriate depending on the particular buffer application. It is to be understood that the invention is not limited to any particular number of control bits generated by the PVT control block 102.

Figure 2:
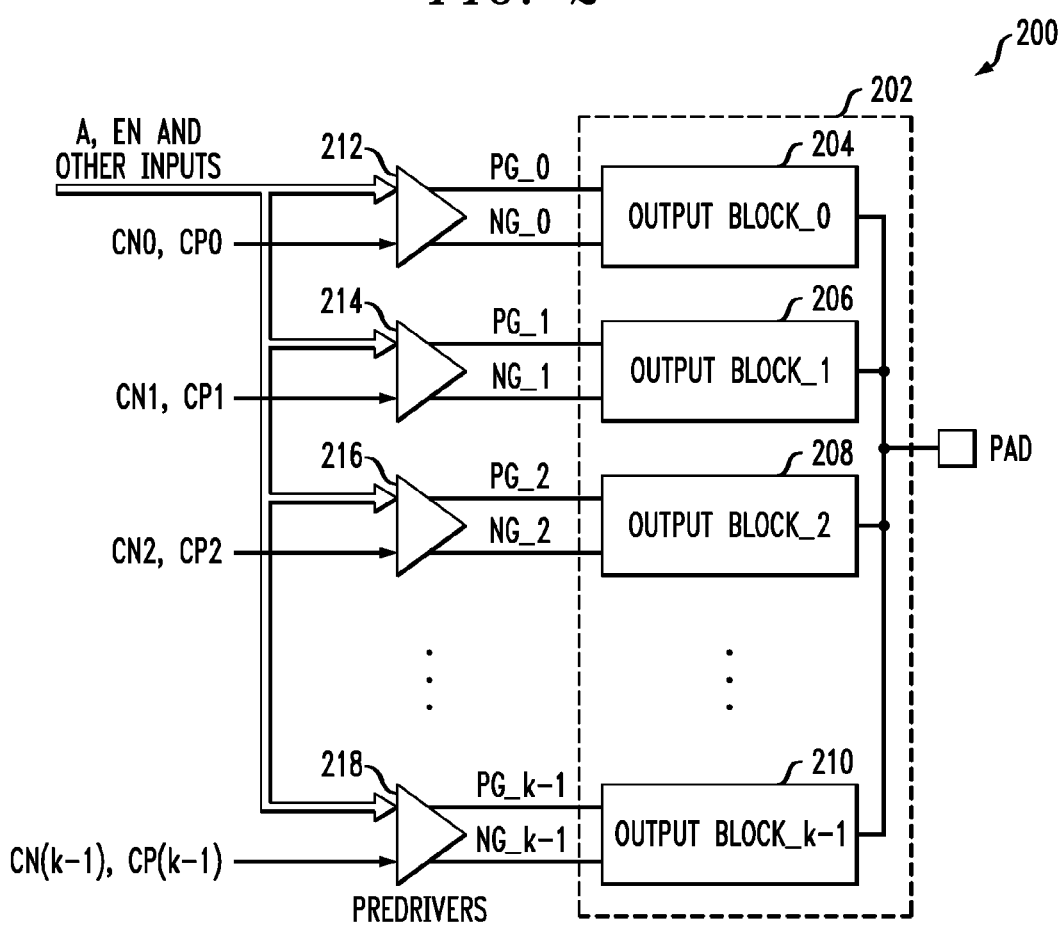
FIG. 2 is a schematic diagram depicting at least a portion of an illustrative compensated buffer circuit which may be modified to implement techniques of the present invention.

FIG. 2 is a schematic diagram depicting at least a portion of an exemplary compensated buffer circuit 200 in which techniques of the present invention may be implemented. Buffer circuit 200 comprises an output stage 202 including a plurality of output blocks, namely, 204 (Output Block_0), 206 (Output Block_1), 208 (Output Block_2) and 210 (Output Block_k−1), based on the number of PVT control bits employed (k in this example). An output of each of the output blocks 204, 206, 208, 210 is connected together and drives an input/output (IO) pad, PAD.

Each of the output blocks in output stage 202 is preferably driven by a corresponding predriver stage. Specifically, PMOS and NMOS outputs PG_0 and NG_0, respectively, generated by predriver 212 drive corresponding inputs of output block 204, outputs PG_1 and NG_1 generated by predriver 214 drive corresponding inputs of output block 206, outputs PG_2 and NG_2 generated by predriver 216 drive corresponding inputs of output block 208, and outputs PG_k−1 and NG_k−1 generated by predriver 218 drive corresponding inputs of output block 210. Each of these predrivers, in turn, is driven by a common input signal A, and an enable signal EN, among other signals. Each of the predrivers also receives corresponding PVT control bits generated by a PVT control block for providing PVT compensation in the buffer circuit 200. More particularly, predriver 212 preferably receives control bits CN0 and CP0, predriver 214 receives control bits CN1 and CP1, predriver 216 receives control bits CN2 and CP2, and predriver 218 receives control bits CN(k−1) and CP(k−1). As previously stated in connection with FIG. 1, in alternative embodiments, the PVT control block may generate only one set of control bits for compensating either PMOS devices or NMOS devices in the buffer circuit 200. It is to be appreciated that the invention is not limited to any particular number of control bits employed by buffer circuit 200.

Certain devices, including wireless handsets, notebook computers and personal digital assistants (PDAs), often employ circuitry which runs on two or more different voltage levels. For instance, circuitry utilized with such devices may be configured so that a portion of the circuitry, such as, for example, IO buffers, runs at a higher voltage level (e.g., about 3.3 volts), as may be supplied by an IO voltage source, while another portion of the circuitry, such as, for example, core logic, runs at a substantially lower voltage level (e.g., about 1.0 volt), as may be supplied by a core voltage source. This difference in voltage levels often necessitates the use of a voltage level translator circuit for interfacing between the multiple voltage levels. It is assumed that the input signals (e.g., A, EN, CNi, CPi, i={0, 1, ..., k−1}) presented to buffer circuit 200 have been translated from a first voltage level (e.g., 1.0 volt), as may be referenced relative to the lower core voltage supply, to a second voltage level (e.g., 3.3 volts), as may be referenced relative to the higher IO voltage supply. When the PVT control bit CNi or CPi (i={0, 1, ..., k−1}) is a logic high level (e.g., active), then the predriver outputs PG_i and NG_i are either both a logic high level if the buffer circuit 200 is driving a logic low level, or is a logic low level if the buffer circuit is driving a logic high level.

The PVT control bits [CN(k−1):CN0] and [CP(k−1):CP0] can be coded, such as, for example, thermometer coded or binary coded, although alternative coding schemes are similarly contemplated. If the control bits are thermometer coded, then the output blocks 204, 206, 208, 210 are preferably configured having respective drive strengths that are substantially equal to one another. Moreover, only one PVT control bit can change at a given time using a thermometer coding such that, starting from when a logic "zero" is first encountered, all bits left of that bit will be zeros. In a binary coded scheme, each output block is preferably configured having a drive strength that is half the drive strength of an output block immediately subsequent to a given output block and twice the drive strength of an output block immediately preceding the given output block. PVT control bits change in a binary sequence using this binary coding scheme.

Buffer circuit 200 may depict an SSTL or HSTL buffer operating in Class-I mode. If Class-II operation is required, a second buffer circuit can be designed wherein each output block would have devices that are sized to be twice the device sizes employed in buffer circuit 200, so that the overall output impedance will be half of buffer circuit 200 designed for Class-I operation. As will become apparent to those skilled in the art, users will have more flexibility using a single buffer that can be configured for either Class-I or Class-II operation as needed. In at least this sense, designing two different buffers offers less flexibility. Moreover, two different buffers would have to be maintained in case one needs any incremental improvements or other modifications in the future and therefore this approach is undesirable.

Figure 3:
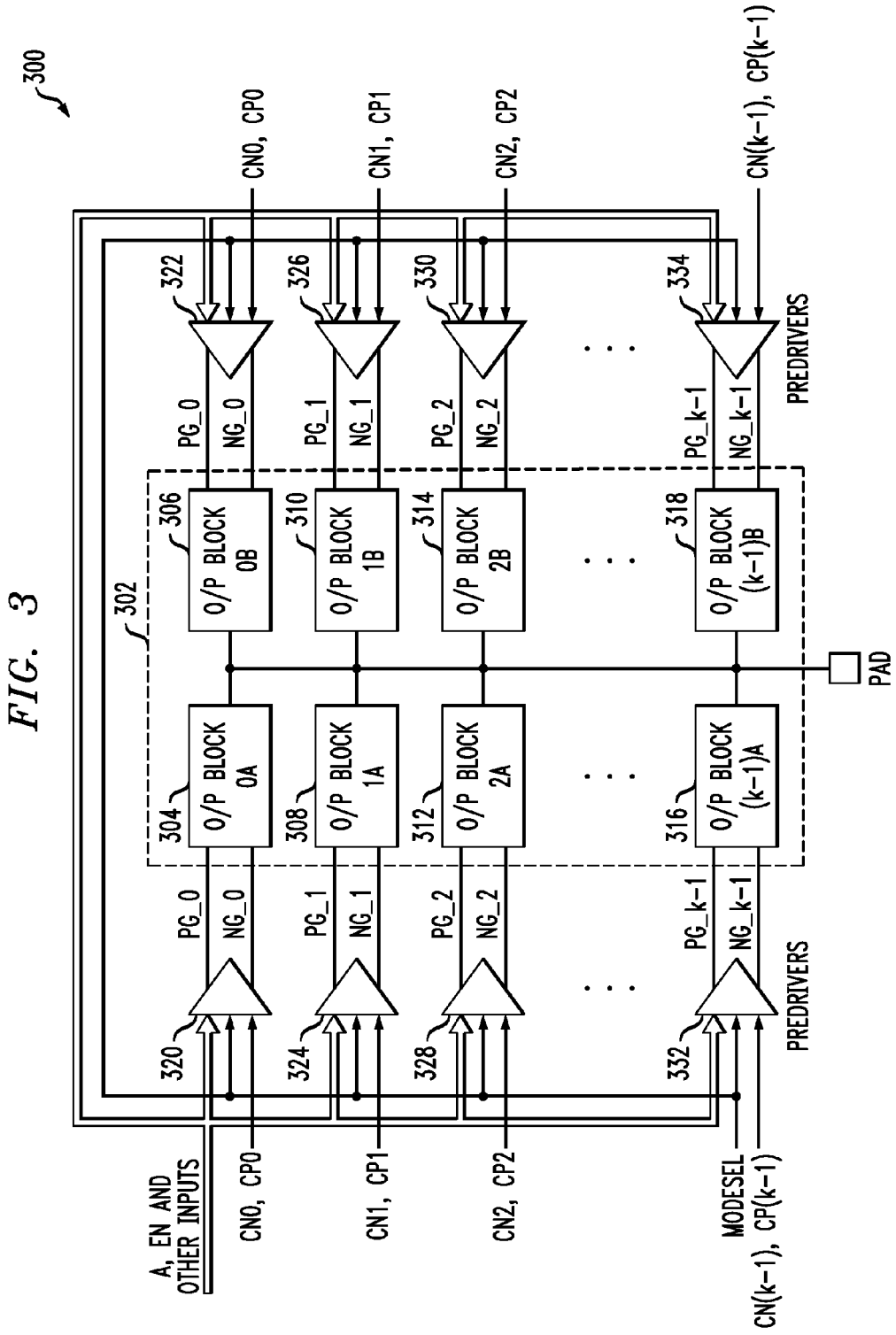
FIG. 3 is a schematic diagram depicting at least a portion of an illustrative compensated buffer circuit operative in multiple drive modes.

FIG. 3 is a schematic diagram depicting at least a portion of an illustrative compensated buffer circuit 300 adapted for operation in two drive modes (e.g., Class-I mode or Class-II mode). Rather than designing two separate buffers, buffer circuit 300 utilizes a common input stage but includes an additional set of predrivers and corresponding output blocks. More particularly, buffer circuit 300 comprises an output stage 302 including a first set of output blocks, namely, 304 (Output (O/P) Block 0A), 308 (O/P Block 1A), 312 (O/P Block 2A) and 316 (O/P Block (k−1)A), and a second set of output blocks, namely, 306 (O/P Block 0B), 310 (O/P Block 1B), 314 (O/P Block 2B) and 318 (O/P Block (k−1)B), based on the number of PVT control bits employed (k in this example). An output of each of the output blocks 304, 306, 308, 310, 312, 314, 316 and 318 is connected together and drives an IO pad (PAD). The second set of output blocks 306, 310, 314, 318 is preferably substantially the same as the first set of output blocks 304, 308, 312, 316. During Class-I operation, the second set of output block is preferably turned off and the IO pad is driven only with the first set of output blocks, which are designed for Class-I operation. During Class-II operation, the second set of output blocks is preferably turned on to thereby provide twice the drive capability of the first set of output blocks alone.

Each of the output blocks in output stage 302 is preferably driven by a corresponding predriver stage. Specifically, PMOS and NMOS outputs PG_0 and NG_0, respectively, generated by predriver 320 drive corresponding inputs of output block 304, outputs PG_0 and NG_0 generated by predriver 322 drive corresponding inputs of output block 306, outputs PG_1 and NG_1 generated by predriver 324 drive corresponding inputs of output block 308, outputs PG_1 and NG_1 generated by predriver 326 drive corresponding inputs of output block 310, outputs PG_2 and NG_2 generated by predriver 328 drive corresponding inputs of output block 312, outputs PG_2 and NG_2 generated by predriver 330 drive corresponding inputs of output block 314, outputs PG_k−1 and NG_k−1 generated by predriver 332 drive corresponding inputs of output block 316, and outputs PG_k−1 and NG_k−1 generated by predriver 334 drive corresponding inputs of output block 318. Each of these predrivers, in turn, is driven by a common input signal A, and an enable signal EN, among other signals. Each of the predrivers receives corresponding PVT control bits generated by a PVT control block for providing PVT compensation in the buffer circuit 300. More particularly, predrivers 320 and 322 preferably receive control bits CN0 and CP0, predrivers 324 and 326 receive control bits CN1 and CP1, predrivers 328 and 330 receive control bits CN2 and CP2, and predrivers 332 and 334 receive control bits CN(k−1) and CP(k−1). In alternative embodiments, only one set of PVT control bits may be generated for compensating either PMOS devices or NMOS devices in the buffer circuit 300. It is to be appreciated that the invention is not limited to any particular number of control bits employed by buffer circuit 300.

Each of the predrivers 320, 322, 324, 326, 328, 330, 332, 334 is also adapted to receive a mode select signal, MODE-SEL, which determines whether the buffer circuit 300 is operating in Class-I mode or Class-II mode. For example, when MODESEL is a logic low level, then Class-I mode is initiated and the first set of predrivers 320, 324, 328, 332 and corresponding output blocks 304, 308, 312, 316 are enabled, and the second set of predrivers 322, 326, 330, 334 and corresponding output blocks 306, 310, 314, 318 are disabled. When MODESEL is a logic high level, both the first and second sets of predrivers and corresponding output blocks are enabled, provided the PVT bit corresponding to each segment is active. In this manner, buffer circuit 300 provides twice the drive capability in Class-II mode compared to Class-I mode, assuming the first and second sets of predrivers and output blocks are substantially the same, as previously stated. Although this approach offer more flexibility compared to buffer circuit 200 shown in FIG. 2, the area occupied by the predrivers in buffer circuit 300 is still quite significant.

Figure 4A:
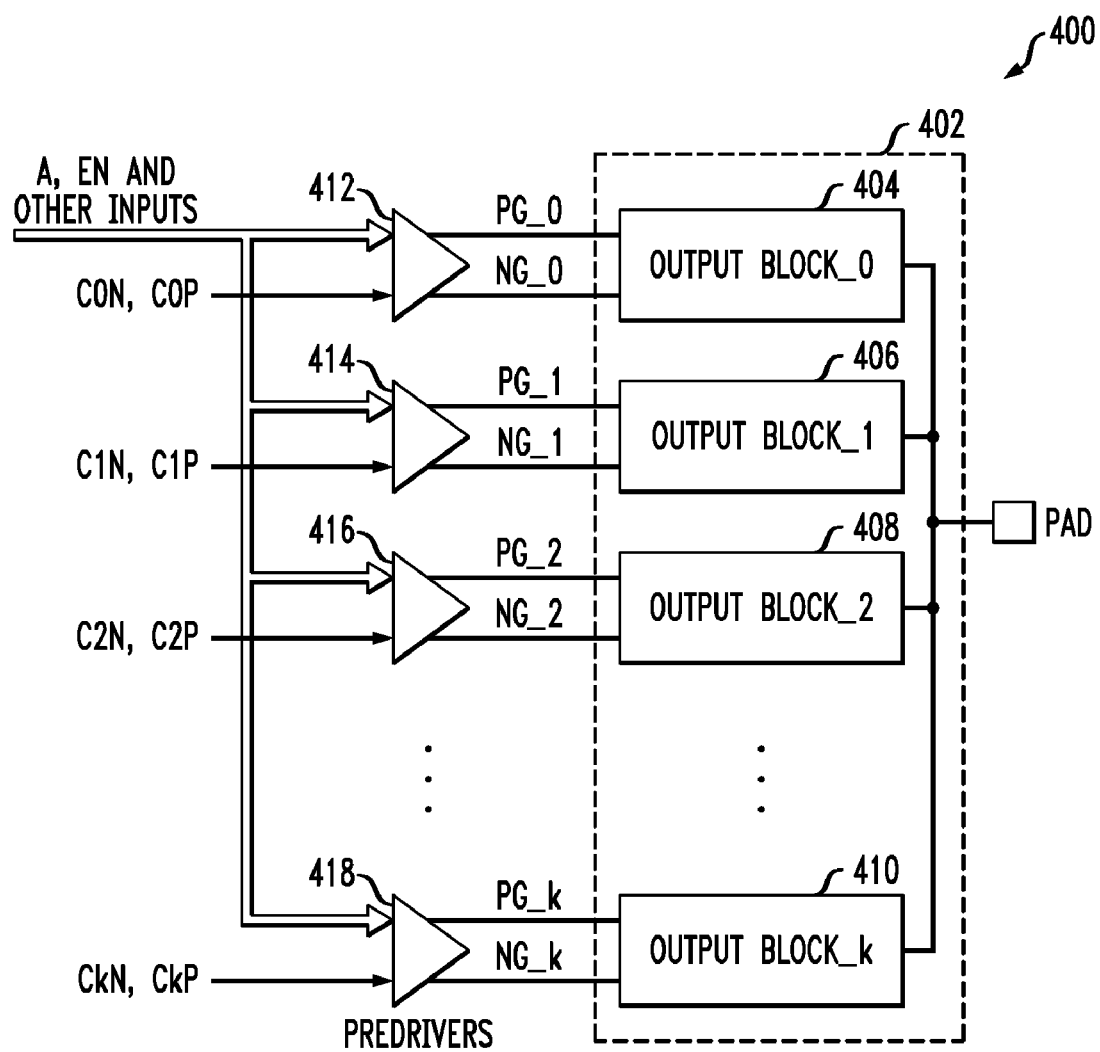
FIGS. 4A and 4B depict at least a portion of an exemplary compensated buffer circuit, formed in accordance with an embodiment of the present invention.
Figure 4B:
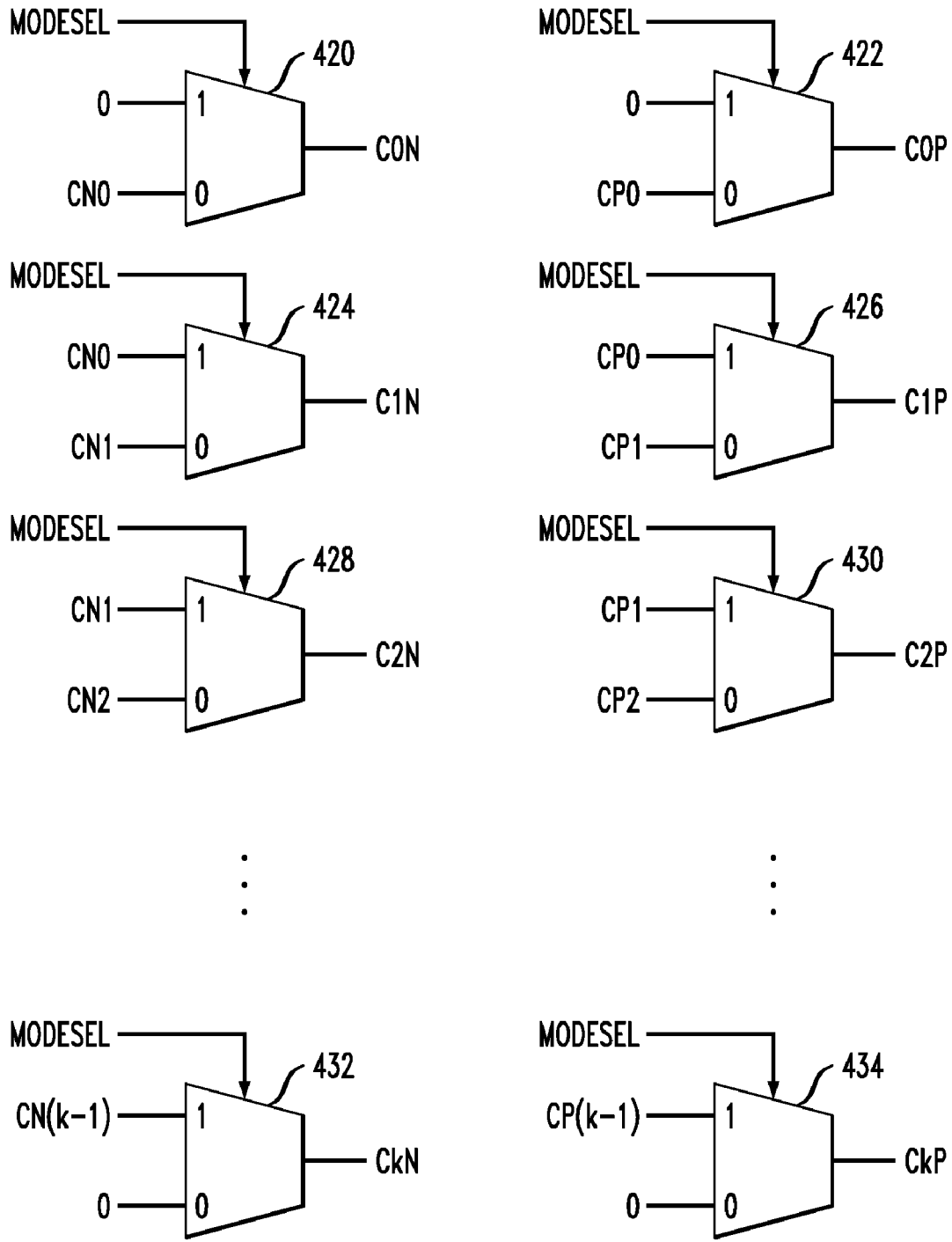

FIGS. 4A and 4B depict at least a portion of an exemplary compensated buffer circuit 400, formed in accordance with an embodiment of the present invention. Rather than including an additional set of k predrivers (for a total of 2 k predrivers) and corresponding output blocks, as in buffer circuit 300 shown in FIG. 3, buffer circuit 400 utilizes only k+1 predrivers and corresponding output blocks and instead modifies the encoding of the PVT control bits used to compensate the buffer circuit for variations in PVT conditions to which the buffer circuit may be subjected. With reference to FIG. 4A, buffer circuit 400 includes an output stage 402 comprising a plurality of output blocks, namely, 404 (Output Block_0), 406 (Output Block_1), 408 (Output Block_2) and 410 (Output Block_k), based on the number of PVT control bits employed (k+1 in this example, where k is an integer greater than zero). The term "block" as used herein is intended to refer broadly to a circuit element (e.g., a transistor) or an arrangement of circuit elements (e.g., an inverter). An output of each of the output blocks 404, 406, 408 and 410 is connected together and drives an IO pad (PAD) or, alternatively, a circuit node.

Each of the output blocks in output stage 402 is preferably driven by a corresponding predriver stage. Although depicted as separate and distinct functional blocks, one or more of the predrivers in buffer circuit 400 may be implemented as a portion of one or more corresponding output blocks (e.g., integrated with an input stage thereof). The term "stage" may be used interchangeably with "block" and is intended to refer broadly to a circuit element or arrangement of circuit elements.

Specifically, PMOS and NMOS outputs PG_0 and NG_0, respectively, generated by predriver 412 drive corresponding inputs of output block 404, outputs PG_1 and NG_1 generated by predriver 414 drive corresponding inputs of output block 406, outputs PG_2 and NG_2 generated by predriver 416 drive corresponding inputs of output block 408, and outputs PG_k and NG_k generated by predriver 418 drive corresponding inputs of output block 410. Each of these predrivers, in turn, is driven by a common input signal A, and an enable signal EN, among other signals. Each of the predrivers also receives corresponding control bits which selectively control whether the predriver is turned on or off at any given time. More particularly, predriver 412 preferably receives control bits C0N and C0P, predriver 414 receives control bits C1N and C1P, predriver 416 receives control bits C2N and C2P, and predriver 418 receives control bits CkN and CkP. The control bits supplied to the predrivers may be referred to collectively as [CkN:C0N] and [CkP:C0P]. The respective control bits supplied to the predrivers collectively represent a binary code word. In alternative embodiments, only one set of control bits, for controlling either PMOS devices or NMOS devices in the buffer circuit 400, may be used. It is to be appreciated that the invention is not limited to any particular number of control bits employed by buffer circuit 400.

It is assumed that output drive strengths of the respective output blocks 404, 406, 408, 410 are binary weighted. Using a binary weighting methodology, the output drive capability of a given output block will be twice that of an output block immediately preceding the given output block. Thus, output block 406 will have a drive capability that is twice that of output block 404, output block 408 will have a drive capability that is twice that of output block 406, and so on. Similarly, in order to minimize the effects of impedance mismatching in the buffer circuit 400, the drive strengths of the respective predrivers are preferably binary weighted. Each of the predrivers is preferably configured having an output loading which is substantially matched to an input loading of a corresponding one of the output blocks to which it is connected so as to minimize signal reflections and/or other loading effects which may occur as a result of mismatching. Therefore, the output drive capability of a given predriver will preferably be twice that of a predriver immediately preceding the given predriver. Accordingly, using a binary weighting arrangement, predriver 414 will have a drive capability that is twice that of predriver 412, predriver 416 will have a drive capability that is twice that of predriver 414, and so on.

In accordance with other embodiments of the invention, the drive strength of one or more predrivers 412, 414, 416, 418 may not be substantially matched to a corresponding output block to which the predriver is connected. Rather, the respective strengths of the predrivers may be skewed slightly so as to reduce the likelihood that the output blocks 404, 406, 408, 410 all switch at the same time. For example, the driver strength of predriver 414 may not be twice that of predriver 412, but may be slightly less than twice (e.g., 1.8 times) or slightly more than twice (e.g., 2.2 times) the drive strength of predriver 412. In this manner, switching noise (e.g., di/dt) is beneficially reduced in the buffer circuit 400.

Figure 5:
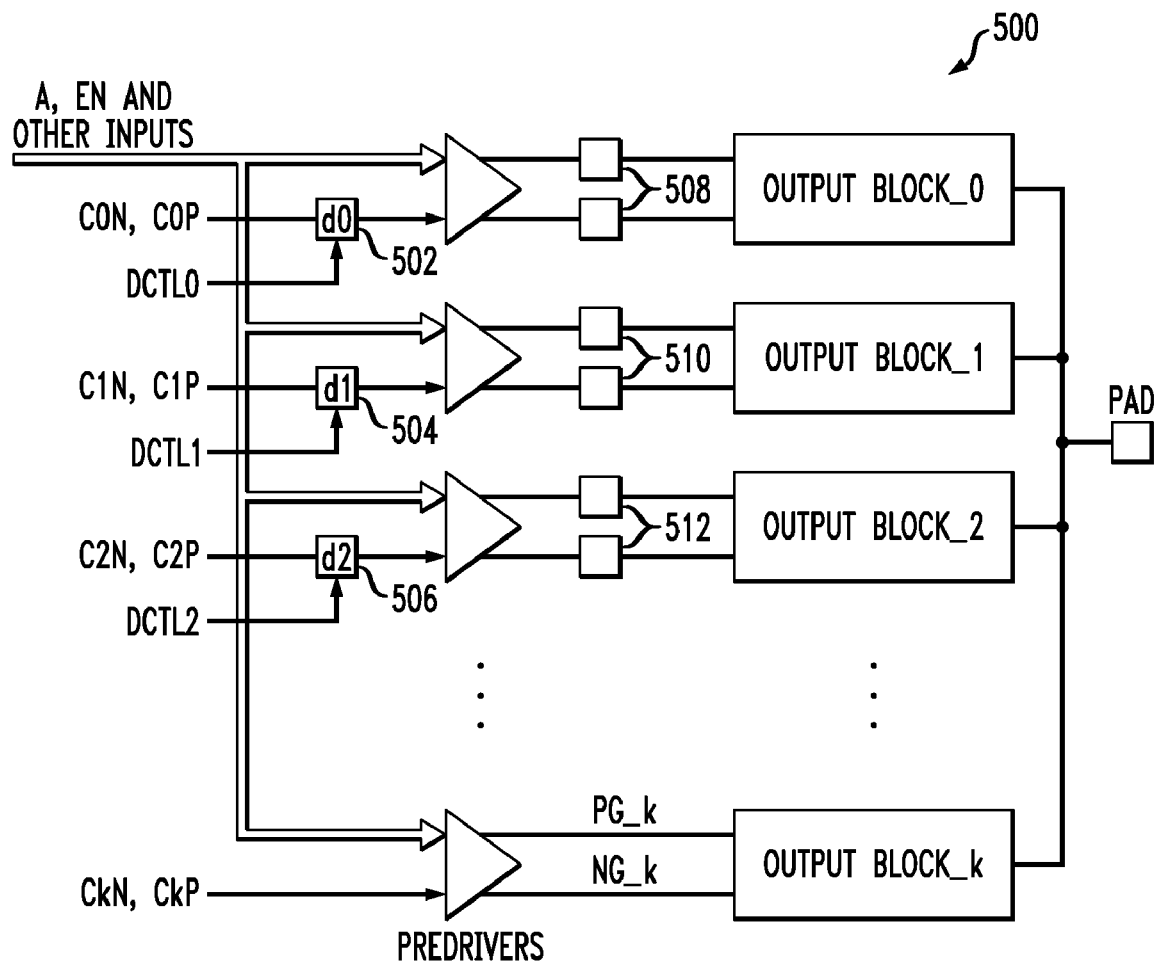
FIG. 5 is a schematic diagram depicting at least a portion of an exemplary compensated buffer circuit, formed in accordance with another embodiment of the present invention.

Alternatively, other embodiments of the invention may employ one or more delay blocks, 502, 504, 506, 508, 510, 512, as shown in the illustrative buffer circuit 500 shown in FIG. 5. Buffer circuit 500 may essentially be the same as the illustrative buffer circuit 400 shown in FIG. 4A, except for the addition of the delay blocks. The delay blocks may be connected in series with a one or more corresponding PVT control signal paths to control when a given output block turns on relative to the other output blocks in the buffer circuit 500. As depicted in FIG. 5, at least a portion of the delay blocks (e.g., 502, 504, 506) can be connected in series with the predriver inputs and/or at least a portion of the delay blocks can be connected in series with the output block inputs (e.g., 508, 510, 512), depending on the amount of delay to be added. The delay added to a signal path by a given delay block may be fixed, as in the case of delay blocks 508, 510 and 512, or the delay may be programmable as a function of one or more control signals, DCTL0, DCTL1 and DCTL2, supplied to the given delay block, as in the case of delay blocks 502 (having a programmable delay d0), 504 (having a programmable delay d1), and 506 (having a programmable delay d2), respectively. It is to be understood that any combination of skewing the respective strengths of one or more predrivers and adding one or more delay blocks may be utilized for reducing switching noise in the buffer circuit.

With reference again to FIGS. 4A and 4B, the control bits [CkN:C0N], used to select whether or not one or more NMOS devices in a given output block is turned on, may be generated by a first plurality of two-input multiplexers, or alternative switching circuitry. Except for the first and last multiplexers, each of the multiplexers is preferably adapted to receive two consecutive PVT control bits, with a given PVT control bit being supplied to two adjacent multiplexers. Specifically, multiplexer 420 preferably receives a logic zero ("0"), which may be zero volt or an alternative voltage indicative of a logic low level, at a first input (e.g., input 1), receives a PVT control bit CN0, generated, for example, by a PVT control block (not shown) or alternative control circuitry, at a second input (e.g., input 0), and generates, as an output, the control bit C0N presented to predriver 412. Multiplexer 424 receives PVT control bit CN0 at a first input, receives PVT control bit CN1 at a second input, and generates the control bit C1N presented to predriver 414. Multiplexer 428 receives PVT control bit CN1 at a first input, receives PVT control bit CN2 at a second input, and generates the control bit C2N presented to predriver 416. Multiplexer 432 receives PVT control bit CN(k−1) at a first input, receives a logic zero ("0") at a second input, and generates the control bit CkN presented to predriver 418. For a buffer circuit operative in more than two modes, multiplexers having more than two inputs may be utilized, as will become apparent to those skilled in the art.

Likewise, where PMOS devices in the respective output blocks are to be compensated in addition to, or in place of, the NMOS devices, a second plurality of two-input multiplexers may be included in buffer circuit 400. More particularly, multiplexer 422 preferably receives a logic zero ("0") at a first input, receives a PVT control bit CP0, generated, for example, by a PVT control block (not shown) or alternative control circuitry, at a second input, and generates, as an output, the control bit C)P presented to predriver 412. Multiplexer 426 receives PVT control bit CP0 at a first input, receives PVT control bit CP1 at a second input, and generates the control bit C1P presented to predriver 414. Multiplexer 430 receives PVT control bit CP1 at a first input, receives PVT control bit CP2 at a second input, and generates the control bit C2P presented to predriver 416. Multiplexer 434 receives PVT control bit CP(k−1) at a first input, receives a logic zero ("0") at a second input, and generates the control bit CkP presented to predriver 418.

It is assumed that a binary coding scheme is employed for the PVT control bits. Using a binary coding methodology, a multiplication by two, as is required to double the output drive capability when switching from Class-I to Class-II operation in buffer circuit 400, can be accomplished by performing a simple arithmetic left shift by one, i.e. shifting all bits one place in the direction of the most significant bit (MSB) and filling the least significant bit (LSB) position with a zero. Here, it is assumed that the kth bit is the MSB. A mode select signal, MODESEL, applied to each of the multiplexers is preferably used to control which of the signals supplied to the two inputs of a given multiplexer will be selected as the output. For example, when MODESEL is a logic low level, Class-I operation is preferably selected and each of the multiplexers 420, 422, 424, 426, 428, 430, 432, 434, provides as an output the respective signals supplied to the first inputs (input 0) thereof. Likewise, when MODESEL is a logic high level, Class-II operation is preferably selected and each of the multiplexers 420, 422, 424, 426, 428, 430, 432, 434, provides as an output the respective signals supplied to the second inputs (input 1) thereof.

More particularly, when Class-I operation is selected (e.g., MODESEL=0), the output C0N of multiplexer 420 will be PVT control bit CN0, the output C0P of multiplexer 422 will be PCT control bit CP0, the output C1N of multiplexer 424 will be PVT control bit CN1, the output C1P of multiplexer 426 will be PVT control bit CP1, the output C2N of multiplexer 428 will be PVT control bit CN2, the output C2P of multiplexer 430 will be PVT control bit CP2, the output CkN of multiplexer 432 will be zero, and the output CkP of multiplexer 434 will be zero. With CkN=0 and CKP=0, output block 410 will be disabled and thereby have no affect on Class-I operation. Similarly, when Class-II operation is selected (e.g., MODESEL=1), the output C0N of multiplexer 420 will be zero, the output C0P of multiplexer 422 will be zero, the output C1N of multiplexer 424 will be PVT control bit CN0, the output C1P of multiplexer 426 will be PVT control bit CP0, the output C2N of multiplexer 428 will be PVT control bit CN1, the output C2P of multiplexer 430 will be PVT control bit CP1, the output CkN of multiplexer 432 will be PVT control bit CN(k−1), and the output CkP of multiplexer 434 will be PVT control bit CP(k−1). Thus, in Class-II mode all of the PVT control bits are left shifted by one, so that each PVT control bit drives an output segment that is twice as strong as the segment it drives in Class-I mode. With C0N=0 and C0P=0, output block 404 will be disabled and thereby have no affect on Class-II operation.

In alternative embodiments of the invention, rather than using multiplexers to generate the control bits for controlling the predrivers, buffer circuit 400 may include a shift register having a number of bits corresponding to the number of predrivers. The shift register may be operative in Class-I mode to generate the control bits C0N, C1N, C2N and CkN for compensating buffer circuit 400 for PVT variations to which the buffer circuit may be subjected. In Class-II mode, the shift register is preferably operative to execute an arithmetic left shift by inserting a logic "0" in the LSB position and shifting each of the other bit positions one place toward the MSB, thereby effectively performing a multiply-by-two operation, as previously stated.

Using the techniques of embodiments of the invention described herein, a dual-mode buffer circuit can be realized with one extra pre-driver and a plurality of multiplexers that occupies an area only slightly larger than a buffer circuit adapted for operation in only a single mode (e.g., Class-I). Furthermore, multiplexers can be implemented in a core voltage level to reduce chip area even further. An overall area savings of about 25 percent or more can be advantageously achieved using this approach.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with the present invention can be employed in any application and/or electronic system in which a buffer circuit is required to operate in at least two different drive modes (e.g., Class-I or Class-II). Suitable systems for implementing techniques of the invention may include, but are not limited, to personal computers, communication networks, electronic instruments (e.g., automated test equipment (ATE)), interface networks, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A compensated buffer circuit operative in at least a first mode and a second mode, the buffer circuit comprising:
a plurality of output blocks, respective outputs of the output blocks being connected together and forming an output of the buffer circuit, the output blocks being arranged in a sequence and being binary weighted such that a drive strength of a given one of the output blocks is about twice as large as a drive strength of an output block immediately preceding the given output block; and
a plurality of predrivers, each of the predrivers having an output connected to an input of a corresponding one of the output blocks and selectively enabling the corresponding output block connected thereto as a function of a control signal supplied to the predriver for compensating an output drive strength of the buffer circuit as a function of variations in at least one of process, voltage and temperature (PVT) conditions to which the buffer circuit may be subjected, the respective control signals supplied to the predrivers collectively representing a binary code word, the binary code word in the second mode being equivalent to an arithmetic shift of the binary code word in the first mode.

2. The buffer circuit of claim 1, further comprising a plurality of multiplexers, each of the multiplexers being arranged in a sequence and being operative to generate a respective one of the control signals as a function of at least one mode select signal supplied to the multiplexers, the control signal generated by each of the multiplexers being equal to a compensation bit corresponding to the control signal when the mode select signal is a first value indicative of the first mode and the control signal being equal to one of a logic zero and a compensation bit of an immediately preceding multiplexer when the mode select signal is a second value indicative of the second mode.

3. The buffer circuit of claim 2, wherein for k compensation bits supplied to the multiplexers, the buffer circuit comprises k+1 output blocks, where k is an integer greater than zero.

4. The buffer circuit of claim 1, further comprising at least one shift register operative in the first mode to generate the control signals supplied to the respective predrivers, the shift register being operative in the second mode to shift all bit positions one place toward a most significant bit of the shift register and to insert a logic zero into a least significant bit position of the shift register.

5. The buffer circuit of claim 4, wherein the at least one shift register is operative to transition from the second mode to the first mode by shifting all bit positions one place toward the least significant bit of the shift register and to insert a logic zero into the most significant bit position of the shift register.

6. The buffer circuit of claim 1, further comprising at least one delay element connected in series with at least one of a signal path of a corresponding one of the control signals supplied to the predrivers and an input of a corresponding one of the output blocks.

7. The buffer circuit of claim 6, wherein a delay value of the at least one delay element is programmable as a function of a delay control signal supplied thereto.

8. The buffer circuit of claim 6, wherein a delay value of the at least one delay element is set to a prescribed amount so as to reduce switching noise in the buffer circuit.

9. The buffer circuit of claim 1, wherein the buffer circuit when in the second mode is configured to have an output drive capability about twice the output drive capability of the buffer circuit when in the first mode.

10. The buffer circuit of claim 1, wherein the binary code word in the second mode is equivalent to an arithmetic left shift of the binary code word in the first mode.

11. A method for controlling an output drive strength of a compensated buffer circuit including a plurality of output blocks, the output blocks being arranged in a sequence and being binary weighted such that a drive strength of a given one of the output blocks is about twice as large as a drive strength of an output block immediately preceding the given output block, and a plurality of predrivers, each of the predrivers having an output connected to an input of a corresponding one of the output blocks, the method comprising the steps of:

supplying each of the predrivers with a control signal for compensating the output drive strength of the buffer circuit as a function of variations in at least one of process, voltage and temperature (PVT) conditions to which the buffer circuit may be subjected, the respective control signals supplied to the predrivers collectively representing a binary code word;

in a first mode of operation of the buffer circuit, arithmetically shifting the binary code word supplied to the predrivers at least one bit position in a direction toward a least significant bit of the binary code word; and in a second mode of operation of the buffer circuit, arithmetically shifting the binary code word supplied to the predrivers at least one bit position in a direction toward a most significant bit of the binary code word, the output drive strength of the buffer circuit in the second mode being about twice the output drive strength of the buffer circuit in the first mode.

12. The method of claim 11, wherein in the first mode, the step of arithmetically shifting the binary code word supplied to the predrivers comprises the steps of:

shifting all bit positions of the binary code word one place toward the least significant bit of the code word; and inserting a logic zero into the most significant bit position of the binary code word.

13. The method of claim 11, wherein in the second mode, the step of arithmetically shifting the binary code word supplied to the predrivers comprises the steps of:

shifting all bit positions of the binary code word one place toward the most significant bit of the code word; and inserting a logic zero into the least significant bit position of the binary code word.

14. An integrated circuit including at least one compensated buffer circuit operative in at least a first mode and a second mode, the at least one buffer circuit comprising:

a plurality of output blocks, respective outputs of the output blocks being connected together and forming an output of the buffer circuit, the output blocks being arranged in a sequence and being binary weighted such that a drive strength of a given one of the output blocks is about twice as large as a drive strength of an output block immediately preceding the given output block; and a plurality of predrivers, each of the predrivers having an output connected to an input of a corresponding one of the output blocks and selectively enabling the corresponding output block connected thereto as a function of a control signal supplied to the predriver for compensating an output drive strength of the buffer circuit as a function of variations in at least one of process, voltage and temperature (PVT) conditions to which the buffer circuit may be subjected, the respective control signals supplied to the predrivers collectively representing a binary code word, the binary code word in the second mode being equivalent to an arithmetic shift of the binary code word in the first mode.

15. The integrated circuit of claim 14, wherein the at least one buffer circuit further comprises a plurality of multiplexers, each of the multiplexers being arranged in a sequence and being operative to generate a respective one of the control signals as a function of at least one mode select signal supplied to the multiplexers, the control signal generated by each of the multiplexers being equal to a compensation bit corresponding to the control signal when the mode select signal is a first value indicative of the first mode and the control signal being equal to one of a logic zero and a compensation bit of an immediately preceding multiplexer when the mode select signal is a second value indicative of the second mode.

16. The integrated circuit of claim 15, wherein for k compensation bits supplied to the multiplexers, the buffer circuit comprises k+1 output blocks, where k is an integer greater than zero.

17. The integrated circuit of claim 14, wherein the at least one buffer circuit further comprises at least one shift register operative in the first mode to generate the control signals supplied to the respective predrivers, the shift register being operative in the second mode to shift all bit positions one place toward a most significant bit of the shift register and to insert a logic zero into a least significant bit position of the shift register.

18. The integrated circuit of claim 17, wherein the at least one shift register is operative to transition from the second mode to the first mode by shifting all bit positions one place toward the least significant bit of the shift register and to insert a logic zero into the most significant bit position of the shift register.

19. The integrated circuit of claim 14, wherein the at least one buffer circuit further comprises at least one delay element connected in series with at least one of a signal path of a corresponding one of the control signals supplied to the predrivers and an input of a corresponding one of the output blocks.

20. The integrated circuit of claim 14, wherein the at least one buffer circuit when in the second mode is configured to have an output drive capability about twice the output drive capability of the buffer circuit when in the first mode.

21. An electronic system, comprising:
at least one integrated circuit including at least one compensated buffer circuit operative in at least a first mode and a second mode, the at least one buffer circuit comprising:
  a plurality of output blocks, respective outputs of the output blocks being connected together and forming an output of the buffer circuit, the output blocks being arranged in a sequence and being binary weighted such that a drive strength of a given one of the output blocks is about twice as large as a drive strength of an output block immediately preceding the given output block; and
  a plurality of predrivers, each of the predrivers having an output connected to an input of a corresponding one of the output blocks and selectively enabling the corresponding output block connected thereto as a function of a control signal supplied to the predriver for compensating an output drive strength of the buffer circuit as a function of variations in at least one of process, voltage and temperature (PVT) conditions to which the buffer circuit may be subjected, the respective control signals supplied to the predrivers collectively representing a binary code word, the binary code word in the second mode being equivalent to an arithmetic shift of the binary code word in the first mode.

* * * * *